(12) United States Patent  
Baker et al.

(10) Patent No.: US 10,293,601 B2  
(45) Date of Patent: May 21, 2019

(54) AUTOMATED CONTROLS FOR CONTOURED SURFACE INKJET PRINTING

(71) Applicant: The Boeing Company, Chicago, IL (US)

(72) Inventors: Anthony W. Baker, Gilbertsville, PA (US); Luke C. Ingram, Summerville, SC (US); Kenneth P. Bowers, III, Charleston, SC (US); Zachary R. Smith, Hanahan, SC (US); David J. Homolak, Charleston, SC (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/646,705

(22) Filed: Jul. 11, 2017

(65) Prior Publication Data  
US 2019/0016121 A1 Jan. 17, 2019

(51) Int. Cl.  
*B41J 2/045* (2006.01)  
*G06F 17/50* (2006.01)

(52) U.S. Cl.  
CPC ....... *B41J 2/04508* (2013.01); *B41J 2/04586* (2013.01); *G06F 17/50* (2013.01)

(58) Field of Classification Search  
CPC ............. A45D 2029/005; B41J 3/4073; G06T 2207/10028; G06T 19/00; G06T 19/20  
See application file for complete search history.

(56) References Cited

U.S. PATENT DOCUMENTS

| | | | | |
|---|---|---|---|---|
| 6,286,517 B1* | 9/2001 | Weber | ................... | A45D 29/00 132/200 |
| 7,470,455 B2* | 12/2008 | Spurgeon | ................. | B41J 3/407 427/553 |
| 9,139,021 B2* | 9/2015 | Nakajima | .............. | B41J 3/4073 |
| 2002/0024544 A1* | 2/2002 | Codos | ................... | B41J 3/4073 347/8 |
| 2006/0071993 A1* | 4/2006 | Baxter | ................... | B41J 3/4073 347/101 |
| 2007/0117030 A1* | 5/2007 | Laidig | ...................... | G03F 1/36 430/5 |
| 2009/0251714 A1* | 10/2009 | Franco | ..................... | E06B 9/24 358/1.9 |

(Continued)

*Primary Examiner* — John Zimmermann  
(74) *Attorney, Agent, or Firm* — Miller, Matthias & Hull LLP

(57) ABSTRACT

A method of developing an automatic control plan for printing on a contoured surface is disclosed. The method includes scanning a contoured surface with a surface scanning device to produce a contoured data set, and creating a multi-dimensional model, with a computing device, of the contoured surface based on the contoured surface data set. Additionally, the method includes inputting a multi-dimensional model of a printing array and an image to be printed onto the contoured surface, into the computing device. The method further includes simulating, on the computing device, a plurality of movements performed by the printing array and a printing by the printing array to apply the image on the contoured surface. Additionally, the method includes, compiling, on the computing device, the automatic control plan which is programmed to execute the plurality of movements of the printing array to apply the image on the contoured surface.

20 Claims, 7 Drawing Sheets

(56) References Cited

U.S. PATENT DOCUMENTS

| | | | |
|---|---|---|---|
| 2011/0135190 A1* | 6/2011 | Maad | A61B 6/0407 |
| | | | 382/154 |
| 2012/0113171 A1* | 5/2012 | Murata | B41J 3/407 |
| | | | 347/2 |
| 2012/0274683 A1* | 11/2012 | Yamasaki | B41J 3/4073 |
| | | | 347/2 |
| 2015/0007841 A1* | 1/2015 | Yamasaki | A45D 29/00 |
| | | | 132/73.5 |
| 2017/0146462 A1 | 5/2017 | Baker et al. | |

* cited by examiner

AUTOMATED CONTROLS FOR
CONTOURED SURFACE INKJET PRINTING

FIELD

The present disclosure relates generally to surface treatment systems and methods, and more specifically to automated controls for ink jet printing along a complex contoured surface.

BACKGROUND

Treating and coating structural surfaces of machines, such as commercial aircraft, is a long and extensive process. Surface treatment often requires coating a structural surface that includes a variety of large contoured surfaces. Furthermore, coating the structural surfaces includes applying multiple layers of coatings for engineering properties, as well as to apply a decorative livery. The decorative livery is applied using a complex process which requires a series of masking operations followed by applying colored paints or coatings where they are needed. These masking and painting operations are serially repeated until the exterior surface treatment is completed. Performing these processes on large areas with a variety of contoured surfaces, therefore, requires a significant amount of time and resources.

SUMMARY

In accordance with one aspect of the present disclosure a method of developing an automatic control plan for printing on a contoured surface is disclosed. The method includes scanning a contoured surface with a surface scanning device to produce a contoured data set. The method further includes creating a multi-dimensional model, with a computing device, of the contoured surface based on the contoured surface data set. Additionally, the method includes inputting, into the computing device, a multi-dimensional model of a printing array configured for printing on the contoured surface. Moreover, the method includes inputting, into the computing device, an image to be printed on the contoured surface and overlaying the image onto the multi-dimensional model of the contoured surface. The method includes simulating, on the computing device, a plurality of movements performed by the printing array in order to print the image on the contoured surface. The method further includes, simulating, on the computing device, a printing by the printing array to apply the image on the contoured surface. The method includes, compiling, on the computing device, the automatic control plan which is configured to execute the plurality of movements of the printing array and selectively activate a plurality of nozzles of the printing array to apply the image on the contoured surface.

In accordance with another aspect of the present disclosure, a system for developing an automatic control plan for a printing array configured to print along a contoured surface is disclosed. The test system includes at least one sensor configured to scan the contoured surface and produce a contoured data set. Furthermore, the test system includes an input module configured to receive the contoured data set and an image file to be printed on the contoured surface. Additionally, the test system includes a computing device communicably coupled to the at least one sensor and the input module, the computing device programmed to analyze the contoured data set and assemble a multi-dimensional model of the contoured surface. Moreover, the test system includes a simulation module operably coupled to the computing device. The simulation module receives the multi-dimensional model of the contoured surface and the image file, wherein the simulation module is configured to verify a control plan configured to control the printing array during printing of the image on the contoured surface.

In accordance with yet another aspect of the present disclosure, an automated surface assembly configured for printing on a contoured surface is disclosed. The automated surface assembly includes an automated printing array configured for printing a surface treatment along the contoured surface and an automated robot operably coupled to the automated printing array. The automated robot is configured to position and move the automated printing array along the contoured surface. The automated surface assembly further includes at least one sensor operably coupled to the automated printing array and configured to scan the contoured surface and produce a contoured data set. Moreover, the automated surface assembly further includes a control system communicably coupled to the automated surface assembly, the control system configured to execute an automated control plan programmed to operate the automated surface assembly. Additionally, the automated surface assembly includes a computing device communicably coupled to the control system and the at least one sensor, the computing device programmed to analyze the contoured data set and assemble a multi-dimensional model of the contoured surface. Furthermore, the automated surface assembly includes an input module operably coupled to the computing device, the input module configured to receive an image file of the surface treatment to be printed on the contoured surface. A simulation module is operably coupled to the computing device, the simulation module receives the multi-dimensional model of the contoured surface and the image file, wherein the simulation module is configure to verify the automated control plan configured to be executed by the control system during operation of the automated surface assembly.

The features, functions, and advantages disclosed herein can be achieved independently in various embodiments or may be combined in yet other embodiments, the details of which may be better appreciated with reference to the following description and drawings.

It should be understood that the drawings are not necessarily to scale, and that the disclosed embodiments are illustrated diagrammatically, schematically, and in some cases in partial views. In certain instances, details which are not necessary for an understanding of the disclosed methods and apparatuses or which render other details difficult to perceive may have been omitted. It should be further understood that the following detailed description is merely exemplary and not intended to be limiting in its application or uses. As such, although the present disclosure is for purposes of explanatory convenience only depicted and described in illustrative embodiments, the disclosure may be implemented in numerous other embodiments, and within various systems and environments not shown or described herein.

DETAILED DESCRIPTION

The following detailed description is intended to provide both devices and methods for carrying out the disclosure. Actual scope of the disclosure is defined by the appended claims.

Figure 1:
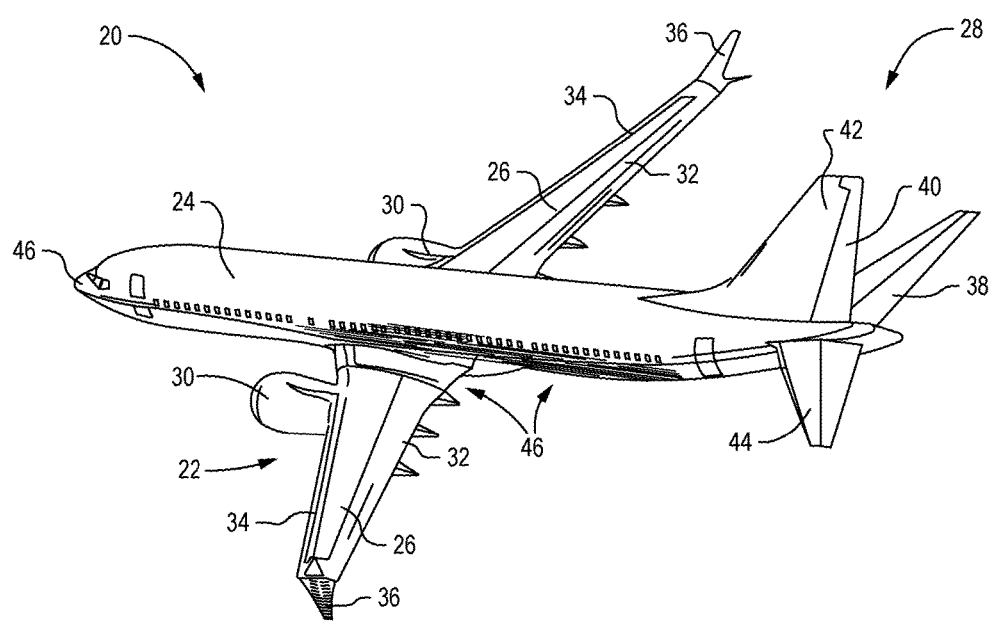
FIG. 1 is a perspective view of an exemplary vehicle constructed in accordance with the present disclosure.

Referring to FIG. 1, a vehicle 20 is illustrated. One non-limiting example of the vehicle 20 is that of an aircraft; however the present disclosure applies to other types of vehicles and machines as well. As illustrated, the vehicle 20 is configured with an airframe 22 which includes a fuselage 24, wings 26, and a tail section 28. In some embodiments, one or more propulsion units 30 are coupled to each wing 26 in order to propel the vehicle 20 in a direction of travel. Furthermore, the wings 26 are fixedly attached to the fuselage 24 and the propulsion units 30 are attached to an underside surface of the wing 26, however other attachment locations of the propulsion units 30 are possible. In some embodiments, the wings 26 are positioned at a substantially centered position along the fuselage 24, and the wings 26 are configured to include a plurality of flaps 32, leading edge devices 34, and peripheral edge devices 36 (i.e., winglets). Moreover, during operation of the vehicle 20, the flaps 32, leading edge devices 34 and peripheral edge devices 36 are capable of being adjusted in a plurality of positions in order to control and stabilize the vehicle 20. For example, the flaps 32 and leading edge devices 34 are adjustable in several different positions to produce the desired lift characteristics of the wings 26. Additionally, the tail section 28 of the airframe 22 includes components which provide other stability and maneuverability functions of the vehicle 20, such as an elevator 38, a rudder 40, a vertical stabilizer fin 42, and a horizontal stabilizer 44.

Figure 2:
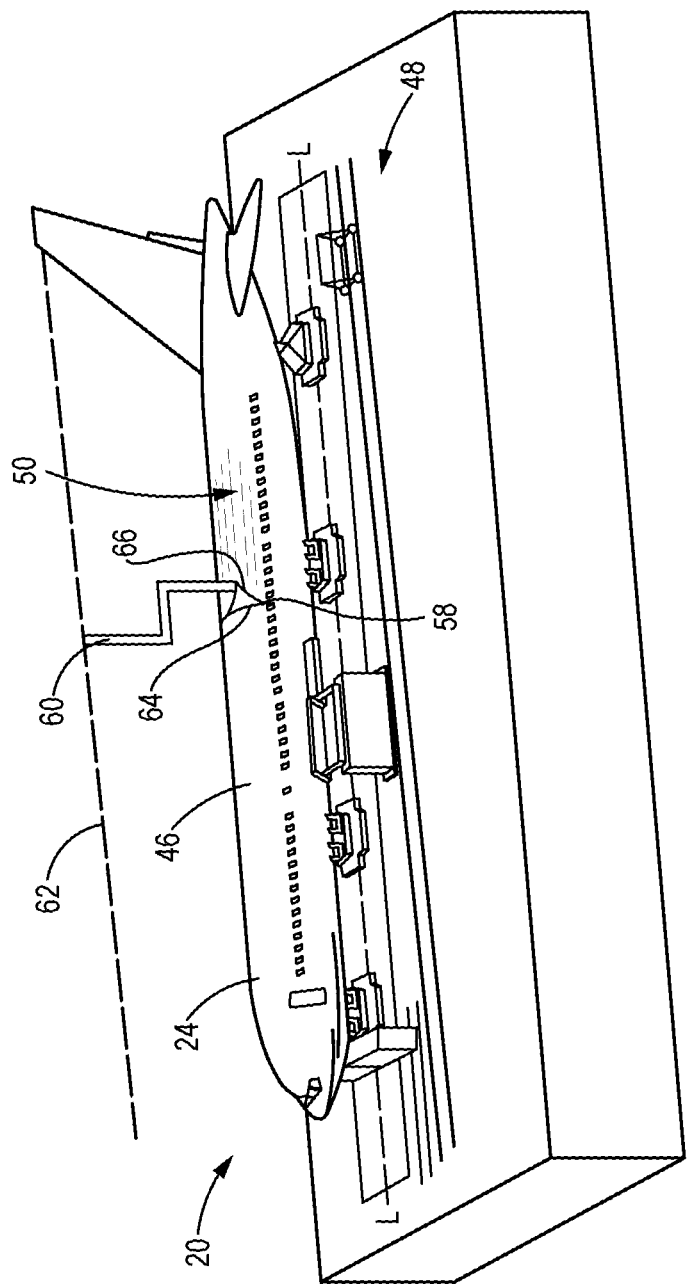
FIG. 2 is a perspective view of an exemplary contoured surface, and surface treatment assembly in accordance with the present disclosure.

FIG. 2 illustrates one non-limiting example of the fuselage 24 with the tail section 28 attached. Generally, the fuselage 24 and other components of the vehicle 20 are constructed out of aluminum, aluminum alloy, titanium, carbon composite, or other known material. Moreover, the fuselage 24 typically forms a tubular structure of the vehicle 20. As such, the fuselage 24 surface exhibits changing dimensions and topography along the length and width of the fuselage 24. As a result, the fuselage 24 is often described as having a contoured surface 46 or other such profile. Furthermore, the wings 26 (FIG. 1) and tail section 28 are vehicle 20 components that also are formed with one or more contoured surface 46. In one embodiment, the contoured surface 46 defines a surface that has a variety of surface profiles formed by a series of changing surface geometries such as but not limited to, an increase in diameter, decrease in diameter, convex surface, concave surface, or other such surface geometry, profile or combination thereof.

During manufacture and/or servicing of the vehicle 20, the fuselage 24, and other such vehicle 20 components, is positioned within a work area 48 and prepared for one or more manufacturing or scheduled service steps. In some embodiments, the manufacturing and/or servicing of the vehicle 20 includes providing one or more treatments along the variety of contoured surfaces 46. Generally, the surface treatment of the contoured surface 46 includes one or more of cleaning, abrading, priming, painting, protecting, repairing, or other such surface treatment of the contoured surface 46. Moreover, one non-limiting example of the treatment of the contoured surface 46 includes applying a decorative livery coating 50 to at least a portion of the fuselage 24, wings 26 (FIG. 1), and tail section 28. The livery coating 50 provides surface protection against the harsh environmental conditions encountered by the vehicle 20, as well as a decorative design that helps identify and distinguish one vehicle 20 from another.

Figure 3:
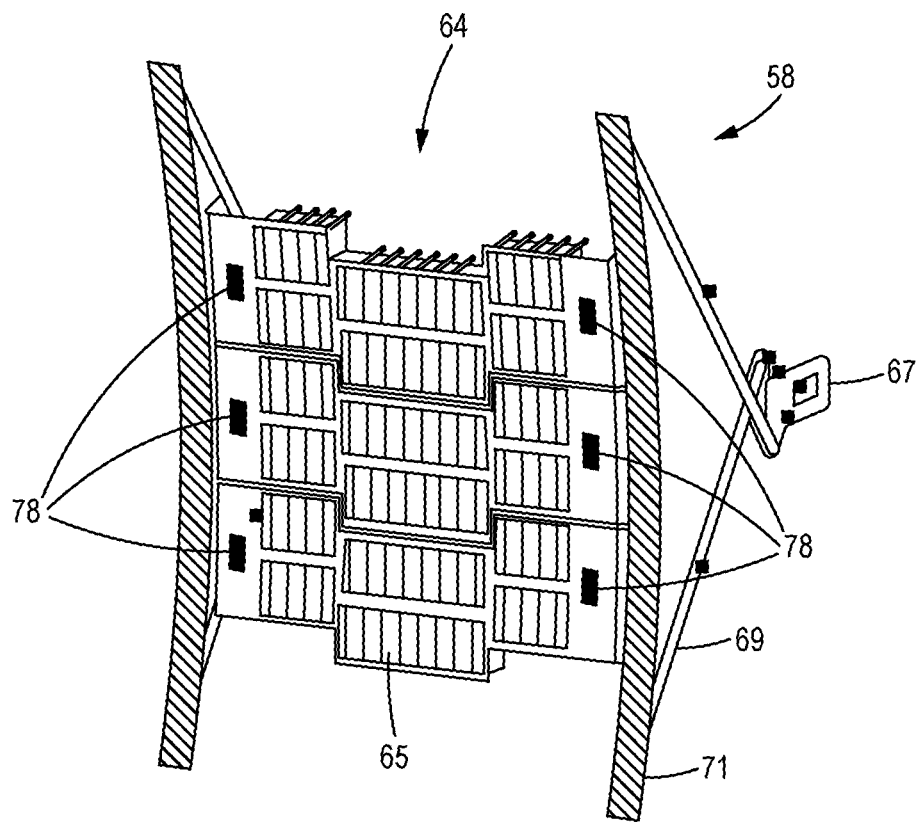
FIG. 3 is a perspective view of an exemplary printing array attached to the surface treatment assembly of FIG. 2, in accordance with the present disclosure.

As further illustrated in FIGS. 2 and 3, the work area 48 is equipped with a surface treatment assembly 58 configured to apply the livery coating 50, or other such surface treatment, along the contoured surface 46 of the vehicle 20. In some embodiments, the surface treatment assembly 58 is attached to a gantry 60. The gantry 60 is configured to provide support and movement of the surface treatment assembly 58 within the work area 48. In one non-limiting example, the gantry 60 is attached to an overhead structure 62 that runs the length L-L of the work area 48 that houses the fuselage 24 or other components of the vehicle 20 during surface treatment. Furthermore, the gantry 60 is configured to move the surface treatment assembly 58 along the length L-L of the work area 48 as it treats the contoured surface 46 of the vehicle 20.

In some embodiments, the surface treatment assembly 58 includes an ink jet printing array 64. FIG. 3 illustrates one exemplary ink jet printing array 64 that can be operably attached to the surface treatment assembly 58 (FIG. 2); however the use of other such printing arrays are possible. The ink jet printing array 64 is configured to dispense the livery coating 50 or other such surface treatment layer along the contoured surface 46. In an embodiment, the contoured surface 46 is defined as the surface of a variety of machined components that have measurable and printable surfaces. As a result, the ink jet printing array 64 is configured to dispense the surface treatment layer (e.g., livery coating 50) along the contoured surface 46. Additionally, the ink jet printing array 64 includes a plurality of ink jet nozzles 65 configured to apply an ink, or other such surface coating onto the contoured surface 46. Generally, each ink jet nozzle 65 is configured to dispense one color from a group of desired colors. In one non-limiting example the group of colors include cyan (C), magenta (M), yellow (Y), and black (K); however, other colors are possible. Furthermore, the surface treatment assembly 58 includes one or more adjustment mechanism 67 configured to adjust the surface treatment assembly 58 and ink jet printing array 64 according to the surface profile of the contoured surface 46. In one non-limiting example the adjustment mechanism 67 includes a set of support arms 69 and an adjustable base 71 that can be actuated or otherwise manipulated to adjust the surface treatment assembly 58.

Moreover, the surface treatment assembly 58 may further incorporate an automated robot 66 operably coupled to the ink jet printing array 64. The automated robot 66 is controlled to position and adjust the ink jet printing array 64 according to the shape and profile of the contoured surface 46. As described above, the contoured surface 46 may be formed or otherwise defined as the measureable and printable surface produced during the assembly of a variety of machined parts (e.g., fuselage 24, wing 26, and winglet 36). Some embodiments of the automated robot 66 have an actuating arm or other such adjustable support structure that is operably coupled to the ink jet printing array 64. As a result, the automated robot 66 and the surface treatment assembly 58 can each be continuously adjusted and controlled to move the surface treatment assembly 58 along the contoured surface 46. Additionally, the automated robot 66 and surface treatment assembly 58 can be adjusted to maintain a normal orientation between the ink jet printing array 64 and the contoured surface 46, maintain the desired dispense gap between the ink jet printing array 64 and the contoured surface 46, and other such adjustments.

Figure 4:
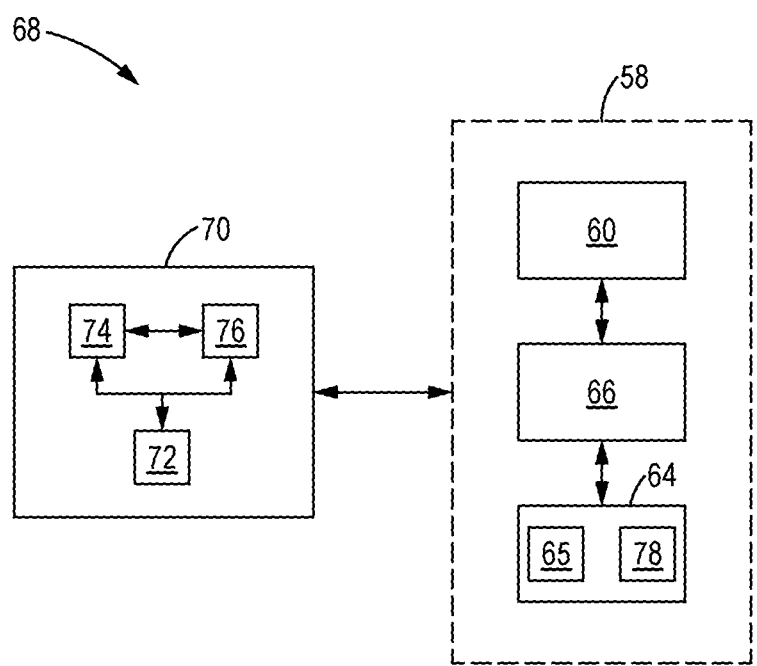
FIG. 4 is a schematic view of a control system for the surface treatment assembly of FIG. 2, in accordance with the present disclosure.

FIG. 4, with continued reference to FIGS. 2 and 3, provides a schematic illustration of an exemplary control system 68 used to operate and control the surface treatment assembly 58 and the automated robot 66. The control system 68 includes a controller 70 that is communicably coupled to the surface treatment assembly 58. Communication between the controller 70 and surface treatment assembly 58 is established using a radio frequency network, a computer data network, a Wi-Fi data network, a cellular data network, a satellite data network, or other such data communication network. Establishing the communication network between the controller 70 and surface treatment assembly 58 allows the controller to send or otherwise communicate control signals to the surface treatment assembly 58 and automated robot 66 during the application of the livery coating 50 (FIG. 2). Moreover, in some embodiments the surface treatment assembly 58 collects data and other information that is sent or otherwise communicated to the controller 70. In some embodiments, the controller 70 uses the data and other information received from the surface treatment assembly 58 to generate and/or update control signals that are sent from the controller 70 to the surface treatment assembly 58 and automated robot. In some cases, the work area 48 (FIG. 2) is configured with more than one surface treatment assembly 58. As a result, the controller 70 can be configured to control and operate more than one surface treatment assembly 58, as needed.

As further illustrated in FIG. 4, the controller 70 includes an input/output module 72 which provides an operator or other interested personnel access to the controller 70. For example, the input/output module 72 is configured with an input device such as but not limited to, a keyboard, mouse, dial, wheel, button, touch screen, microphone, or other input device. The operator can use the input device of the input/output module 72 to enter or otherwise execute commands and instructions to be performed by the controller 70. Additionally, the input/output module 72 is configured with an output device such as but not limited to a monitor, screen, speaker, printer, or other output device. As a result, data and other information that is generated by the controller 70 can be output to the operator by the output device of the input/output module 72. Additionally, in an embodiment, the controller 70 further includes a processor module 74 and a memory module 76 and the processor module 74 executes or otherwise performs instructions provided by software that is stored in the memory module 76 or other such software storage location.

As discussed above, the controller 70 is communicably coupled to the surface treatment assembly 58 and the automated robot 66 to send operational commands during operation. In some embodiments, the controller 70 is also configured to send operational control signals to the gantry 60 to move the surface treatment assembly 58 and automated robot 66 along the contoured surface 46 of the fuselage 24 or other component to be treated. Alternatively, the surface treatment assembly 58 can be mounted or otherwise attached to an automated guided vehicle (AGV) configured to move the surface treatment assembly 58 and automated robot 66 around the work area 48 (FIG. 2). As a result, the controller 70 can be communicably coupled to the AGV and the controller 70 sends or otherwise transmits control signals to the AGV. In one non-limiting example the AGV is positioned on the floor of the work area 48 and the AGV travels along the length L-L of the work area 48 during treatment of the contoured surface 46 (FIG. 2).

The surface treatment assembly 58 and more specifically, the automated robot 66 are operably coupled to the ink jet printing array 64. Moreover, an embodiment of the automated robot 66 has one or more actuating devices that operably couple the adjustment mechanism 67 of the ink jet printing array 64 to the automated robot 66. As a result, control signals sent between the controller 70 and surface treatment assembly 58 further include actuation commands for actuating devices which move and adjust the ink jet printing array 64 relative to the contoured surface 46 (FIG. 2). For example, the actuating devices are controlled such that the ink jet printing array 64 maintains a normal orientation and proper dispense gap relative to the contoured surface 46 (FIG. 2). Additionally, in some embodiments, the control signals from the controller 70 include commands to activate and/or deactivate individual ink jet nozzles 65 of the ink jet printing array 64 in order to dispense or otherwise apply the livery coating 50 along the contoured surface 46 (FIG. 2).

Furthermore, the ink jet printing array 64 includes one or more sensors 78 configured to scan and collect data during operation of the surface treatment assembly 58. In one non limiting example, the sensor 78 includes a surface scanning laser configured to scan and collect surface topography data of the contoured surface 46 and the surrounding areas. For example, the sensor 78 scans the contoured surface 46 (FIG. 2) to collect metrology and other surface profile data, such as but not limited to, surface roughness data, surface imaging data, location/positioning data, height sense data, angular orientation data, and any other such surface data. This data is transmitted or otherwise sent back to the controller 70 for analysis. In some embodiments, the controller 70 generates and/or updates control signals for the surface treatment assembly 58 based off the sensor 78 data analysis. Additionally or alternatively, sensor 78 data is stored in the memory module 76 to be analyzed at a later time. It will be understood that laser scanning sensors are one type of data collecting device that is used as the sensor 78 to be used; however, other types of sensors and/or combinations thereof, such as an interferometer, a capacitive transducer, an ultrasound transducer, a camera, or other such sensor, can be incorporated with the automated robot 66 or other component of the surface treatment assembly 58, and configured to collect data used to adjust and control the surface treatment assembly 58.

Figure 5:
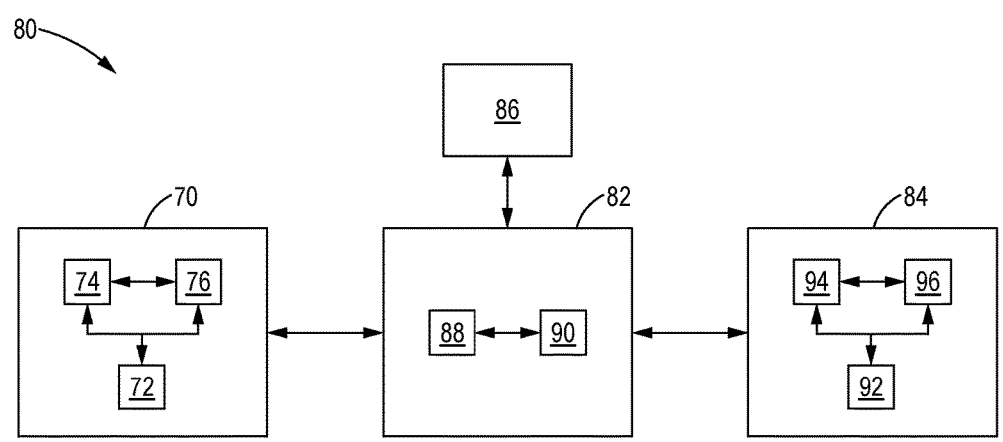
FIG. 5 is a schematic view of a computer device network, in accordance with the present disclosure.

Referring now to FIG. 5, a schematic of a computer device network 80 used to develop, program, simulate and transmit control plans for the control system 68 (FIG. 4), is shown. In one non-limiting example, the computer device network 80 includes a network server 82, a computing device 84 (i.e., desktop computer, laptop computer, tablet, or smart-phone), and the controller 70. In some embodiments, the computer device network 80 includes multiple network servers 82, computing devices 84, and controllers 70 communicably coupled with one another; however for simplicity a single network server 82, computing device 84 and controller 70 is illustrated in FIG. 5. As such, the computer device network 80 is configured to create a communication network in which the network server 82, the computing device 84 and the controller 70 are communicably coupled with one another. Communication between the network server 82, computing device 84, and controller 70 is established using a radio frequency network, a computer data network, a Wi-Fi data network, a cellular data network, a satellite data network, or other such data communication network. In some embodiments, the network server 82 is configured as a centralized computing and communication device that facilitates the sending and receiving of data from each of the computing device 84 and controller 70; however other configurations of the computer device network are possible.

Furthermore, in an embodiment, the network server 82 is coupled to a network database 86 that contains data and information related to the control and operation of the surface treatment assembly 58. The network database 86 includes data and information such as but not limited to, surface topography data, image or design data to be printed, print head data, control plan data, and other such data. Moreover, the network server 82 and network database 86 are configured such that the data stored in the network database 86 is accessible to the computing device 84, controller 70 and other such computing devices. Additionally, data collected by the one or more sensors 78 (FIGS. 3 and 4) can be sent to the network server 82 from the controller 70. In some embodiments, the network server 82 receives the data for analysis by the network server 82 or computing device 84. Alternatively, the network server 82 sends the data received from the controller 70 to be stored in the network database 86 for later reference and analysis. In order to perform various network tasks such as but not limited to, facilitating communication between computing device 84 and controller 70, managing and storing data, and other such tasks, the network server 82 further includes at least one server processor 88 that is communicably coupled to a server memory module 90. Generally, the server processor 88 is configured to execute instructions provided by a computer program stored in the server memory module 90. The server memory module 90 includes memory devices such as but not limited to, random access memory (RAM) read-only memory (ROM) and other such memory devices. As a result, the computer program, or in some cases multiple computer programs provide instructions followed and executed by the network server 82 in order to perform one or more tasks for the computer device network 80.

In some embodiments, the network server 82 and the computing device 84 work together to analyze data and information in order to generate a control plan for the surface treatment assembly 58 (FIG. 2). In some cases, the network server 82 and computing device 84 perform one or more simulations during the programming of the control plan because the application of the livery coating 50 (FIG. 2) along the contoured surface 46 (FIG. 2) is a complicated process. One or more simulations can be run by the network server 82 and/or computing device 84 to test out the control plan for the surface treatment assembly 58, including the automated robot 66, and ink jet printing array 64 (FIGS. 2 and 3). The simulation results can be analyzed by the network server 82 and computing device 84 to confirm the devised control plan will accurately apply the livery coating 50 (FIG. 2) or other surface treatment to the contoured surface 46 (FIG. 2). Additionally, the simulation results can be used by the network server 82 and computing device 84 to revise and improve the control plan to correct any control plan errors detected during the simulation.

The computing device 84 includes a computing device input/output module 92, a computing device processor module 94, and a computing device memory module 96. In some embodiments, the computing device input/output module 92 is configured with an input device such as but not limited to, a keyboard, mouse, dial, wheel, button, touch screen, microphone, or other input device. Additionally, the input/output module 72 is configured with an output device such as but not limited to a monitor, screen, speaker, printer, or other output device. As a result, a user can input commands and instructions to be performed by the computing device 84, and, view data and other information that is generated by the computing device 84. Additionally, in an embodiment, the computing device processor module 94 is configured to execute instructions outlined in computer software stored in the computing device memory module 96. The computing device processor module 94 and computing device memory module 96 are communicably coupled to one another such that the computing device processor module 94 retrieves and executes the instructions and/or other such data stored on the computing device memory module 96. Moreover, data and other information generated by the instructions executed by the computing device processor module 94 can be stored on the computing device memory module 96. Generally, the computing device memory module 96 is a computer hardware device capable of repeated memory retrieval and/or storage such as random access memory (RAM), read-only memory (ROM), flash memory, hard disk drive, solid state disk drive, or other such memory device.

Figure 6:
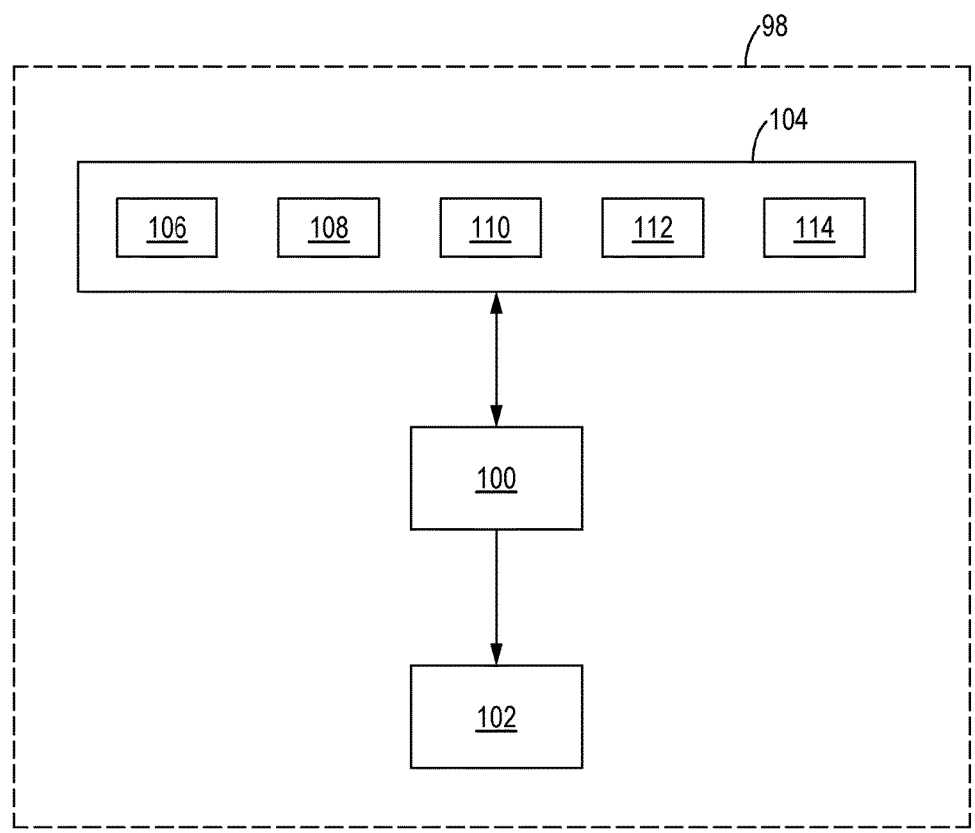
FIG. 6 is a schematic view of a computer program executed on the computer device network of FIG. 5, in accordance with the present disclosure.

Referring now to FIG. 6, a schematic is shown of a computer software 98 used for programming and simulating a control plan. The computer software 98 operates on the network server 82 and the computing device 84 accesses the computer software 98 over the computer device network 80. Alternatively, the computer software 98 is stored locally on the computing device memory module 96 of the computing device 84 and the user can activate and operate the computer software 98 directly from the computing device input/output module 92. In an embodiment, the computer software 98 is programmed to perform a simulation 100 of the surface treatment assembly 58 applying the livery coating 50 (FIG. 2), or other surface treatment, along the contoured surface 46 (FIG. 2) of the fuselage 24, wing 26 (FIG. 1), or other vehicle 20 component (FIG. 1). Furthermore, the results of the simulation 100 are used by the computer software 98 generate or otherwise program a control plan 102 that is executed by the surface treatment assembly 58 (FIG. 2) during the treatment of the contoured surface 46 (FIG. 2). The control plan 102 provides a set of instructions for the surface treatment assembly 58, which includes the ink jet printing array 64 and automated robot 66, to follow and execute while applying the livery coating 50 along the contoured surface 46. Additionally or alternatively, the results of the simulation 100 are used to validate and/or update a previously devised control plan 102 and the computer software 98 generates an updated or corrected control plan 102.

In an embodiment, the computer software 98 receives one or more input parameters 104 that are used by the computer software 98 during the simulation 100. The input parameters 104 are entered, or otherwise input, into the computer software 98 using the computing device input/output module 92. Alternatively, the input parameters 104 are stored in the network database 86 (FIG. 4), or other location of the computer device network 80 (FIG. 5). As such, the input parameters 104 are imported or uploaded into the computer software 98, as needed to run the simulation 100. Generally, the input parameters 104 include information related to the surface treatment assembly 58 (FIG. 2) and the contoured surface 46 (FIG. 2); however, the input parameters 104 can be configured to include other information and data needed to complete the simulation 100. For example, one such input parameter 104 used by the computer software 98 is the print profile 106. In some embodiments, the print profile 106 defines the desired resolution, in dots per inch (DPI), of the livery coating 50 (FIG. 2) to be applied to the contoured surface 46 (FIG. 2). Additionally, the input parameters 104 include a dispense gap 108 that is entered into the computer software 98. The dispense gap 108 defines an acceptable range for the distance (i.e., minimum and maximum distance) between the ink jet printing array 64 (FIG. 2) and the contoured surface 46 (FIG. 2). Moreover, a three-dimensional (3D) model 110 of the ink jet printing array 64 (FIG. 2) is entered or otherwise provided as one of the input parameters 104. In an embodiment, the 3D model 110 of the ink jet printing array 64 is stored in the network database 86 (FIG. 4) and the user loads or imports the 3D model 110 of the ink jet printing array 64 into the computer software 98; however other storage locations of the 3D model 110 of the ink jet printing array 64 are possible.

Furthermore, the input parameters 104 include a 3D surface mesh or scan 112 of the contoured surface 46 (FIG. 2) that is entered into the computer software 98. As mentioned above, the contoured surface 46 (FIG. 2) is formed by a series of changing surface geometries such as but not limited to, an increase or decrease in diameter, a convex surface, a concave surface, or other such surface geometry, profile or combination thereof. As such, the 3D surface mesh 112 provides an accurate contour map that includes the vertices, edges and faces which define the surface profile of the contoured surface 46 (FIG. 2). The 3D surface mesh 112 is incorporated into the simulation 100 by the computer software 98 in order to confirm that the control plan 102 correctly directs and controls the movement of the surface treatment assembly 58 along the contoured surface 46 during application of the livery coating 50 (FIG. 2).

In one non-limiting example, the simulation 100 performed by the computer software 98 uses the dispense gap 108, the 3D model 110 of the ink jet printing array 64, and the 3D surface mesh of the contoured surface 46 to confirm that the ink jet printing array 64 does not contact the contoured surface 46 (FIG. 2). Additionally, such input parameters 104 assist the simulation 100 to predict whether the livery coating 50 (FIG. 2) is properly applied to the contoured surface 46 (FIG. 2). In some cases, the simulation 100 identifies issues with the control plan and the computer software 98 provides a corrective action or modification to the control plan using the specific input parameters 104 provided by the user.

Referring back to FIG. 3, with continued reference to FIG. 6, the ink jet printing array 64 and/or the surface treatment assembly 58 includes one or more sensors 78 configured to scan the contoured surface 46 (FIG. 2). In one non-limiting example, the sensor 78 is a surface scanning laser configured to scan and collect surface topography and surface profile data such as but not limited to, surface roughness, surface imaging data, location/positioning data, height sense data, angular orientation data, and other surface profile data of the contoured surface 46 and the surrounding areas. As a result, in an embodiment, the one or more sensors 78 is used to scan the contoured surface 46 (FIG. 2) to provide the 3D surface mesh 112 for the input parameters 104 entered into the computer software 98. It will be understood that while laser scanning sensors are one type of sensor 78 to be used, other sensors and/or a combination different sensors, such as an interferometer, a capacitive transducer, a camera, or other such sensor, can be incorporated with the ink jet printing array 64 and/or surface treatment assembly 58. Moreover, the 3D surface mesh 112 can also be defined from other data and information provided by the user.

Additionally, the input parameters 104 illustrated in FIG. 6 include a two-dimensional (2D) image file 114 that is entered into the computer software 98. In one non-limiting example, the 2D image file 114 includes the design of the livery coating 50 (FIG. 2) to be applied along the contoured surface 46 (FIG. 2). During the simulation 100, the computer software 98 overlays or superimposes the 2D image file 114 onto the 3D surface mesh 112 of the contoured surface 46 (FIG. 2) to be treated.

Furthermore, upon completion of the simulation 100, the computer software 98 outputs the control plan 102 used by the controller 70 (FIGS. 4 and 5) or other such controlling device to operate the surface treatment assembly 58 (FIG. 4). In one non-limiting example, the control plan 102 is communicated over the computer device network 80 of FIG. 5. Alternatively, the control plan 102 is loaded onto the network database 86 and the control plan 102 is accessed using the controller 70 by a user of the surface treatment assembly 58 (FIGS. 4 and 5).

Figure 7:
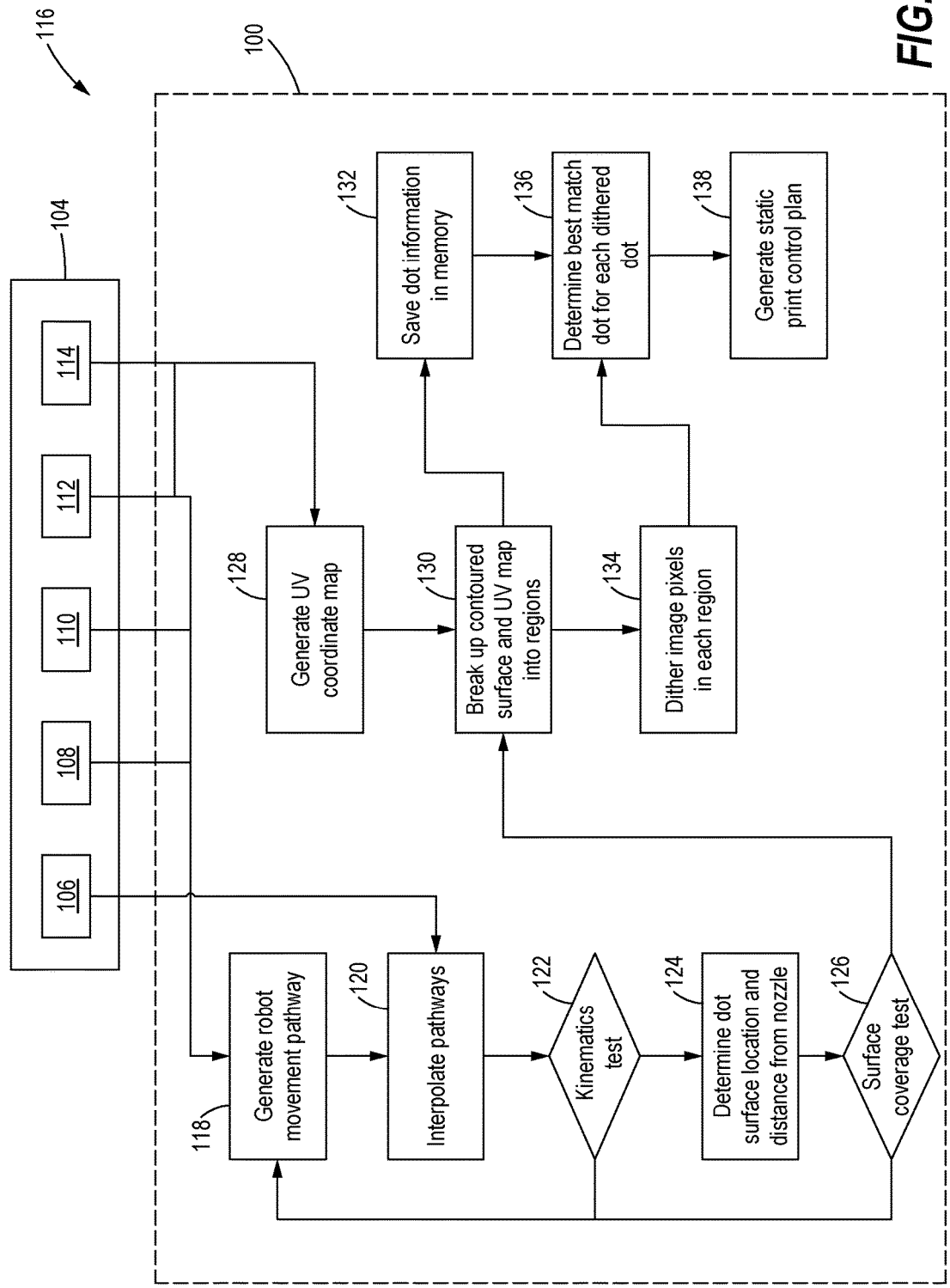
FIG. 7 is a flow chart of a simulation module of the computer program of FIG. 6, in accordance with the present disclosure.

Referring now to FIG. 7, with continued reference to FIGS. 1-6, a method 116 of performing the simulation 100 is shown. In some embodiments, the simulation 100 is run by the computing device 84 and/or network server 82 to generate and optimize the control plan 102 that is programmed to operate and control the surface treatment assembly 58. In a first block 118, the dispense gap 108, 3D model 110 of the ink jet printing array 64, and the 3D surface mesh 112 are provided as input parameters 104 and used by the simulation 100. The simulation 100 further analyzes the dispense gap 108, the 3D model 110 of the ink jet printing array 64, and the 3D surface mesh 112 in order to generate a series of movement pathways for the automated robot 66. The movement pathways for the automated robot 66 are based off of the data and information provided by the input parameters 104; however, additional information can be provided by the user that the automated robot 66 will follow during treatment of the contoured surface 46.

Additionally, in block 120, the print profile 106 information from the input parameters 104 is combined with the movement pathways for the automated robot 66 that were generated in block 118. The print profile 106 information includes the specified or desired resolution for the livery coating 50 to be applied along the contoured surface 46. The resolution (i.e., DPI) specified in the print profile 106 is used to interpolate or modify the specified movement pathways for the automated robot 66. As a result, the livery coating 50 will be applied with the desired resolution as the surface treatment assembly 58 prints along the contoured surface 46.

In a next block 122, the simulation 100 performs a robot kinematics test to evaluate the generated movement pathways of the automated robot 66. The robot kinematics test is configured to confirm that the automated robot 66 moves according to the generated movement pathways. Furthermore, the simulation 100 confirms that the generated movement pathways, to be executed by the automated robot 66, will be executed without issue. For example, during the application of the livery coating 50 the ink jet printing array 64 is positioned adjacent to the contoured surface 46 and the robot kinematics test confirms that the proposed movement pathways do not cause any collisions between the surface treatment assembly 58 and the contoured surface 46.

In an embodiment, if the kinematics test performed in block 122 is not passed, the simulation 100 returns back to block 118 to optimize and regenerate the movement pathways for the automated robot 66. In one non-limiting example, the results of the failed kinematics test produced in block 122 will be analyzed by the computer software 98 during the regeneration of movement pathway in attempt to optimize the movement pathway for the automated robot 66. Additionally or alternatively, the user can be notified of the failed kinematics test in block 122. The user can then analyze the results and edit the movement pathways accordingly. Once the portion of the simulation 100 passes the robot kinematics test performed in block 122, the simulation 100 will proceed on to a next block 124.

In block 124, each step or indexed movement the automated robot 66 makes along the movement pathway is further analyzed to determine the location of a dot to be dispensed from the ink jet printing array 64. As discussed above, the ink jet printing array 64 includes a plurality of ink jet nozzles 65, and each ink jet nozzle 65 of the ink jet printing array 64 is configured to dispense a specific color of ink. Generally, the ink jet nozzles 65 are configured to dispense one color from a group of desired colors. One non limiting example of the group of colors includes cyan (C), magenta (M), yellow (Y), and black (K); however the ink jet nozzles 65 can be configured to dispense other colors as needed or desired. Furthermore, the 3D model 110 of the ink jet printing array 64 included in the input parameters 104 and referenced by the computer software 98 further includes defining the tool center point (TCP) of the ink jet printing array 64. As a result, the simulation 100 can use the defined TCP of the ink jet printing array 64 to determine the location of each ink jet nozzle 65 relative to the defined TCP of the ink jet printing array 64. Furthermore, the defined TCP allows the computer software 98 to compute or otherwise determine the shoot direction of each ink jet nozzle 65 relative to the TCP of the ink jet printing array 64. In some embodiments, the incorporation of the ink jet nozzle 65 location information and ink jet nozzle 65 shoot direction information allows the simulation 100 to predict, monitor and analyze the location of each dot to be dispensed from the ink jet printing array 64.

Furthermore, each dot distance between the contoured surface 46 and the respective ink jet nozzle 65 of the ink jet printing array 64 is predicted, monitored, and analyzed at each step or index the automated robot 66 makes along the movement pathway. In some embodiments, the calculated distance between each dot and ink jet nozzle 65 can be compared to the dispense gap 108 range (i.e., minimum and maximum) that was defined or otherwise entered as one of the input parameters 104. As a result, the simulation 100 further confirms that the distance between each dot on the contoured surface 46 and the ink jet nozzle 65 corresponds with the minimum and maximum distance defined by the dispense gap 108.

In a next block 126, the simulation 100 performs a surface coverage test to determine the surface coverage of each dot to be dispensed along the contoured surface 46. During the surface coverage test, the dot coverage is analyzed independent of the desired image (i.e., livery coating 50) that is to be printed along the contoured surface 46. As such, the simulation 100 checks for the correct dot location on the contoured surface 46. Furthermore, the surface coverage test performed is configured to confirm the correct dot distance between each nozzle and the contoured surface 46 that was calculated in the previous block 124. If the dot coverage on the contoured surface 46 does not pass the surface coverage test, then the simulation 100 returns back to block 118 to repeat the generation of movement pathways for the automated robot 66 and the subsequent defined steps of the simulation 100. In some embodiments, the computer software 98 references and uses the results obtained during the surface coverage test, and other portions of the simulation 100, to update some of the input parameters 104 or other such data used by the computer software 98. As a result, one or more corrective actions is performed by the computer software 98 in order to help the simulation 100 pass both the kinematics test performed in block 122 and the surface coverage test performed in block 126.

Furthermore, the simulation 100 includes analyzing the 3D surface mesh 112 of the contoured surface 46 and the 2D image file 114 (i.e., livery coating 50) that are input into the computer software 98. In some cases, printing livery coating 50 such that it is properly displayed is difficult because of the changing surface profile and geometry (i.e., convex, concave, increasing/decreasing diameter) encountered by the surface treatment assembly 58 as it moves along the contoured surface. As a result, in block 128, a UV coordinate map is generated by the computer software 98 or other such computer program. Generally, the UV coordinate map is produced by projecting the 2D image (i.e., livery coating 50, 2D image file 114) onto a 3D surface (i.e., contoured surface 46, 3D surface mesh 112). Moreover, creation of the UV coordinate map permits the 3D object (i.e., 2D image file 114 projected on the 3D surface mesh 112 of contoured surface 46) to be broken up into several polygons, or other such shapes. As a result, in some embodiments, the UV coordinate map is used by the simulation 100 to evaluate how the 2D image file 114 appears after it is overlaid and mapped across the 3D surface mesh 112 of the contoured surface 46.

Referring back to block 126, once the surface coverage test for the dots is passed, then in a next block 130, the simulation 100 proceeds to continue processing the UV coordinate map, generated in block 128, by breaking up the 3D surface mesh 112 of the contoured surface 46 and the 2D image file 114 into multiple regions or mesh faces. As discussed above, 3D surface mesh 112 provides a surface profile of the portion of the contoured surface 46 intended to be treated by the surface treatment assembly 58. Often times, this includes a large surface area so the computer software 98 breaks up the 3D surface mesh 112 into a plurality of polygon regions to make the printing process more manageable. Typically, the 3d surface mesh 112 is broken up into polygon regions such as but not limited to, triangles, rectangles, and/or squares; however other polygon shapes are possible. Similarly, the 2D image file 114 is broken up into corresponding polygon regions. Furthermore, creating the UV coordinate map includes defining or assigning pixels (i.e., dots) of the 2D image (i.e., 2D image file 114) which correspond to the surface mappings included in the plurality of polygons that make up the 3D object (i.e., 3D surface mesh 112). Put another way, the UV coordinates of the UV coordinate map serve as markers that control which pixels (i.e., dots) on the 2D image correspond to specific vertices on the polygons of the 3D object.

Once the UV coordinate map of the 2D image and the 3D surface are broken up into regions, in a next block 132, the pixel (i.e., dot) information is stored by computing device 84 in the computing device memory module 96 or other such memory location. In one non-limiting example, pixel/dot information stored in the computing device memory module 96 includes the region index, course index, step index, pixel/dot color (i.e., C, M, Y, and K), nozzle index, and other such pixel/dot information. Alternatively, the pixel/dot information can be stored in the network data base 86 or other such data storage location.

Additionally, once the 3D surface mesh 112 of the contoured surface 46 and the 3D image file 114 is broken up into the respective regions or mesh faces, then in a next block 134, the simulation 100 produces and evaluates a dithering of the pixels of the 2D image file within each region or mesh face of the 3D surface mesh 112. In this case, dithering is used to expand the available colors for applying the livery coating 50 along the contoured surface 46 because the ink jet printing array 64 is configured with the four primary colors (C, M, Y, K) that are typically used in ink jet printing. As such, dithering uses diffusion of the available color pixels to approximate colors not included in the four colors (C, M, Y, K), or other identified color palette. As a result, dithering of the image pixels determines the specific dot colors (i.e., C, M, Y, and K) that are needed to be dispensed at specific locations along the contoured surface 46 in order to make up the pixel colors of the 2D image file 114. Furthermore, dithering of the image pixels is configured to replicate the 2D image file 114 on the 3D surface mesh 112 with the resolution in DPI that is specified in the print profile 106 or other such input parameter 104. In one non-limiting example, the print profile 106 includes a print resolution of 300 DPI for the 2D image file 114; however other resolutions for the 2D image file 114 are possible.

Furthermore, in a next block 136, the simulation 100 combines the dithering of pixels performed with block 134 with the dot information stored in the computing device memory module 96, or other such storage location in block 130. As a result, the simulation 100 then determines which dot information (i.e., region index, course index, step index, color, and nozzle index) matches up best with the dithered dots present within each region of the 3D surface mesh 112 and 2D image file 114. In one non-limiting example, the best matching dot information for each dithered dot will be selected to produce the dot that minimizes the 3D distance, produces the dot within the minimum/maximum shoot distance range defined by the dispense gap 108, and provides guaranteed surface coverage that was verified in the surface coverage test in block 126.

Referring now to block 138, the simulation 100 outputs a static print control plan for controlling the surface treatment assembly 58 during the treatment of the contoured surface 46. The simulation 100 is configured such that the static print control plan confirms that the selected best match dots include the correct course index, step index, color (C, M, Y, and K) and nozzle index. The static print control plan is prepared to be executed by the surface treatment assembly 58.

In some embodiments, the static control plan produced in block 138 is transmitted or otherwise accessed by the control system 68 for the surface treatment assembly 58. In one non-limiting example, the control plan is configured to control the automated robot 66 as it moves through each step along each course along the devised movement pathway. Furthermore, at each step, the control plan is configured output the current and next position of the automated robot 66 as well as the specified speed the automated robot 66 is instructed to move along the movement pathway. Additionally, in some embodiments, the control plan provides scheduling instructions and trigger instructions at interpolated DPI spacing along the tool center point (TCP) axis. The scheduling and trigger instructions are confirmed to be consistent with the simulation 100 such that the livery coating 50 is applied with the specified image resolution, such as but not limited to 300 DPI along the contoured surface 46. Furthermore, the control plan provides instructions executed by the controller 70 which control the surface treatment assembly 58 to apply the livery coating 50 on the contoured surface 46 according to the control plan.

While the foregoing detailed description has been given and provided with respect to certain specific embodiments, it is to be understood that the scope of the disclosure should not be limited to such embodiments, but that the same are provided simply for enablement and best mode purposes. The breadth and spirit of the present disclosure is broader than the embodiments specifically disclosed and encompassed within the claims appended hereto. Moreover, while some features are described in conjunction with certain specific embodiments, these features are not limited to use with only the embodiment with which they are described, but instead may be used together with or separate from, other features disclosed in conjunction with alternate embodiments.

What is claimed is:

1. A method of developing an automatic control plan for printing on a contoured surface, the method comprising:
    scanning a contoured surface, with a surface scanning device, to produce a contoured surface data set;
    creating a three-dimensional surface mesh model, with a computing device, of the contoured surface based on the contoured surface data set;
    inputting, into the computing device, a three-dimensional model of a printing array configured for printing on the contoured surface;
    inputting, into the computing device, a two-dimensional image to be printed on the contoured surface and overlaying the two-dimensional image onto the three-dimensional surface mesh model of the contoured surface;
    generating, on the computing device, a UV coordinate map based on the two-dimensional image;
    overlaying, on the computing device, the UV coordinate map onto the three-dimensional surface mesh model of the contoured surface, wherein the UV coordinate map defines a plurality of UV coordinates of the two-dimensional image that correspond to a location on the three-dimensional surface mesh model;
    executing a simulation on the computing device, the simulation including:
        generating a plurality of movements of the three-dimensional model of the printing array based on the three-dimensional surface mesh model of the contoured surface and the two-dimensional image to be printed on the contoured surface, and
        confirming the plurality of movements will be executed and the two-dimensional image will be printed on the contoured surface without issue,
    compiling, on the computing device, the automatic control plan based on confirmation that the plurality of movements can be executed without issue; and
    outputting the automatic control plan to a surface treatment assembly configured to execute the automatic control plan and print the two-dimensional image along the contoured surface.

2. The method of claim 1, wherein defining the plurality of UV coordinates of the UV coordinate map of the two-dimensional image includes assigning a plurality of pixels of the two-dimensional image, and wherein each pixel of the plurality of pixels correspond with a specific set of vertices of the three-dimensional surface mesh model.

3. The method of claim 2, wherein the UV coordinate map of the two-dimensional image and the three-dimensional surface mesh model of the contoured surface are broken up into a plurality of polygon regions and wherein compiling the automatic control plan further includes meshing the plurality of polygon regions back together.

4. The method of claim 1, wherein the printing array comprises an inkjet printing array and simulating the printing includes configuring each nozzle, of the plurality of nozzles, to dispense a color droplet from one of a cyan color, a magenta color, a yellow color, or a black color.

5. The method of claim 4, wherein simulating the dispensing of the color droplet further includes determining a spacing between the color droplet dispensed from each nozzle, of the plurality of nozzles, to produce the two-dimensional image on the contoured surface.

6. The method of claim 4, wherein simulating the dispensing of the color droplet further includes determining a dispense gap between each nozzle, of the plurality of nozzles, and the contoured surface.

7. The method of claim 1, wherein inputting the three-dimensional model of the printing array includes defining an array center point and mapping out a location of each nozzle, of the plurality of nozzles, with respect to the array center point.

8. A system for developing a control plan for a printing array configured to print along a contoured surface, the system comprising:
at least one sensor configured to scan the contoured surface and produce a contoured data set;
an input module configured to receive the contoured data set, a two-dimensional image file to be printed on the contoured surface, and a three-dimensional model of the printing array;
a computing device communicably coupled to the at least one sensor and the input module, the computing device programmed to analyze the contoured data set and assemble a three-dimensional surface mesh model of the contoured surface, wherein the computing device generates a UV coordinate map based on the two-dimensional image, and wherein the UV coordinate map is overlaid onto the three-dimensional surface mesh model of the contoured surface such that the UV coordinate map defines a plurality of UV coordinates of the two-dimensional image that correspond to a location on the three-dimensional surface mesh model; and
a simulation module operably coupled to the computing device, the simulation module receives the three-dimensional surface mesh model of the contoured surface, the two-dimensional image file, and the three-dimensional model of the printing array, wherein the simulation module executes a simulation programmed to generate a plurality of movements of the multi-dimensional model of the printing array based on the multi-dimensional model of the contoured surface and the image to be printed on the contoured surface, and wherein the simulation module compiles and outputs the control plan based on confirmation that the plurality of movements can be executed without issue.

9. The system of claim 8, wherein the plurality of UV coordinates of the UV coordinate map define a plurality of pixels of the two-dimensional image, and wherein each pixel of the plurality of pixels correspond with a specific set features of the three-dimensional mesh model.

10. The system of claim 9, wherein the UV coordinate map of the two-dimensional image and the three-dimensional surface mesh model of the contoured surface is broken up into a plurality of polygon regions, and wherein the control plan further includes meshing the plurality of polygon regions together to print the two-dimensional image on the contoured surface.

11. The system of claim 8, wherein the printing array includes a plurality of nozzles and wherein the input module receives a three-dimensional model of the printing array that defines an array center point such that a location of each nozzle, of the plurality of nozzles, is mapped out with respect to the array center point.

12. The system of claim 11, wherein the printing array comprises an inkjet printing array and the each nozzle, of the plurality of nozzles, is configured to dispense a color droplet from one of a cyan color, a magenta color, a yellow color, or a black color.

13. The system of claim 11, wherein the simulation module being further configured to determine a spacing between a color droplet dispensed onto the contoured surface by each nozzle, of the plurality of nozzles.

14. The system of claim 11, wherein the simulation module being further configured to determine a dispense gap between each nozzle, of the plurality of nozzles and the contoured surface.

15. An automated surface assembly configured for printing on a contoured surface, the automated surface assembly comprising:
an automated printing array configured for printing a surface treatment along the contoured surface;
an automated robot operably coupled to the automated printing array and configured to position and move the automated printing array along the contoured surface;
at least one sensor operably coupled to the automated printing array and configured to scan the contoured surface and produce a contoured data set;
a control system communicably coupled to the automated surface assembly and configured to execute an automated control plan programmed for operating the automated surface assembly;
a computing device communicably coupled to the control system and the at least one sensor, the computing device programmed to analyze the contoured data set and assemble a three-dimensional surface mesh model of the contoured surface;
an input module operably coupled to the computing device, the input module configured to receive a two-dimensional image file of the surface treatment to be printed on the contoured surface and a three-dimensional model of the automated printing array, wherein the computing device generates a UV coordinate map based on the two-dimensional image file, and wherein the UV coordinate map is overlaid onto the three-dimensional surface mesh model of the contoured surface such that the UV coordinate map defines a plurality of UV coordinates of the two-dimensional image file that correspond to a location on the three-dimensional surface mesh model; and
a simulation module operably coupled to the computing device, the simulation module receives the three-dimensional surface mesh model of the contoured surface, the two-dimensional image file, and the three-dimensional model of the automated printing array, wherein the simulation module executes a simulation programmed to generate a plurality of movements of the three-dimensional model of the automated printing array based on the three-dimensional surface mesh model of the contoured surface and the two-dimensional image to be printed on the contoured surface, and wherein the simulation module compiles and outputs the automated control plan based on confirmation that the plurality of movements can be executed without issue.

16. The automated surface assembly of claim 15, wherein the plurality of UV coordinates of the UV coordinate map define a plurality of pixels of the two-dimensional image, and wherein each pixel of the plurality of pixels correspond with a specific set features of the three-dimensional mesh model.

17. The automated surface assembly of claim 16, wherein the UV coordinate map of the two-dimensional image file and the three-dimensional surface mesh model of the contoured surface is broken up into a plurality of polygon regions, and wherein the control plan further includes meshing the plurality of polygon regions together to print the surface treatment that corresponds with the two-dimensional image file on the contoured surface.

18. The automated surface assembly of claim 15, wherein the printing array includes a plurality of nozzles, and wherein the plurality of inputs further includes providing a three-dimensional model of the printing array that defines an array center point such that a location of each nozzle, of the plurality of nozzles, is mapped out with respect to the array center point.

19. The automated surface assembly of claim 18, wherein the printing array comprises an inkjet printing array and the each nozzle, of the plurality of nozzles is configured to dispense a color droplet from one of a cyan color, a magenta color, a yellow color, or a black color.

20. The automated surface assembly of claim 18, wherein the control plan further includes determining a spacing between a color droplet dispensed onto the contoured surface and determining a dispense gap between each nozzle, of the plurality of nozzles and the contoured surface.

* * * * *